United States Patent [19]
Pommer

[11] Patent Number: 6,147,870
[45] Date of Patent: Nov. 14, 2000

[54] PRINTED CIRCUIT ASSEMBLY HAVING LOCALLY ENHANCED WIRING DENSITY

[75] Inventor: Richard J. Pommer, Trabuco Canyon, Calif.

[73] Assignee: Honeywell International Inc., Morris Township, N.J.

[21] Appl. No.: 09/195,913

[22] Filed: Nov. 19, 1998

Related U.S. Application Data

[63] Continuation-in-part of application No. 08/583,645, Jan. 5, 1996, Pat. No. 5,839,188.
[51] Int. Cl.[7] ...................................................... H05K 1/11
[52] U.S. Cl. ........................ 361/746; 361/736; 361/760; 361/735; 174/255; 174/257; 174/265; 228/180.21; 428/166
[58] Field of Search .................................... 361/746, 728, 361/729, 736, 760, 735, 744, 793, 792; 174/255, 256, 258, 257, 260; 228/180.21; 428/166

[56] References Cited

U.S. PATENT DOCUMENTS

| | | |
|---|---|---|
| Re. 35,064 | 10/1995 | Hernandez ............................... 361/163 |
| 2,692,190 | 10/1954 | Pritikin . |
| 2,721,822 | 10/1955 | Pritikin . |
| 3,181,986 | 5/1965 | Pritikin . |
| 3,350,498 | 10/1967 | Leeds . |
| 3,475,213 | 10/1969 | Stow . |
| 3,680,037 | 7/1972 | Nellis ................................... 339/61 M |
| 3,823,252 | 7/1974 | Schmid ................................... 174/68.5 |
| 3,835,531 | 9/1974 | Luttmer ..................................... 29/625 |
| 3,982,320 | 9/1976 | Buchoff et al. ....................... 29/630 R |
| 3,986,255 | 10/1976 | Mandal .................................... 29/626 |
| 4,064,623 | 12/1977 | Moore ....................................... 29/629 |
| 4,157,932 | 6/1979 | Hirata ..................................... 156/310 |
| 4,159,222 | 6/1979 | Lebow et al. ........................... 156/632 |
| 4,545,840 | 10/1985 | Newman et al. ....................... 156/276 |

(List continued on next page.)

FOREIGN PATENT DOCUMENTS

| | | |
|---|---|---|
| 0 265 212 | 4/1988 | European Pat. Off. . |
| 0 270 067 | 6/1988 | European Pat. Off. . |
| 0 330 452 | 8/1989 | European Pat. Off. . |
| 0 379 736 | 8/1990 | European Pat. Off. . |
| 0 477 004 | 3/1992 | European Pat. Off. . |

(List continued on next page.)

*Primary Examiner*—Jayprakash N. Gandhi
*Assistant Examiner*—David Foster
*Attorney, Agent, or Firm*—Curtis B. Brueske

[57] ABSTRACT

A printed circuit assembly and method of making the same facilitates the attachment of high density modules onto a printed circuit board. In one embodiment, the high density modules are attached to the printed circuit board using an adhesive having a conductive material disposed within at least one via. In an alternate embodiment, an adhesive layer including a plurality of non-conductive "gauge particles" disposed within a non-conductive adhesive is used to attach the module to the printed circuit board. When the adhesive layer is disposed between a module and a printed circuit, individual gauge particles are interposed or sandwiched at various points between the layers such that the diameters of the particles control the layer separation throughout overlapping areas of thereof, thereby permitting careful control over layer separation. A printed circuit assembly and method of making the same utilize in another embodiment an interlayer interconnecting technology incorporating conductive posts that are deposited on one of a pair of contact pads formed on a module that opposes a printed circuit board and is thereafter bonded to the other in the pair of contact pads during lamination. Fusible material may be utilized in the conductive posts to facilitate mechanical bonding to a contact pad, and the posts project through a dielectric layer disposed between the printed circuit boards, thereby forming the electrical connections between the boards at discrete locations. The conductive posts may also comprise a conductive ink.

10 Claims, 7 Drawing Sheets

U.S. PATENT DOCUMENTS

| | | | |
|---|---|---|---|
| 4,604,644 | 8/1986 | Beckham et al. | 357/80 |
| 4,740,657 | 4/1988 | Tsukagoshi et al. | 174/88 |
| 4,771,159 | 9/1988 | O'Leary | 219/85 M |
| 4,778,635 | 10/1988 | Hechtman et al. | 264/24 |
| 4,814,040 | 3/1989 | Ozawa | 156/634 |
| 4,908,258 | 3/1990 | Hernandez | 428/210 |
| 4,991,285 | 2/1991 | Shaheen et al. | 29/830 |
| 5,001,302 | 3/1991 | Atsumi | 174/94 |
| 5,038,251 | 8/1991 | Suiyama et al. | 361/398 |
| 5,041,183 | 8/1991 | Nakamura et al. | 156/264 |
| 5,046,238 | 9/1991 | Daigle et al. | 29/830 |
| 5,060,844 | 10/1991 | Behun et al. | 228/180.2 |
| 5,093,986 | 3/1992 | Mandai et al. | 29/843 |
| 5,112,464 | 5/1992 | Tsou et al. | 204/265 |
| 5,137,791 | 8/1992 | Swisher | 428/612 |
| 5,147,084 | 9/1992 | Behun et al. | 228/56.3 |
| 5,154,341 | 10/1992 | Melton et al. | 228/180.2 |
| 5,203,075 | 4/1993 | Angulas et al. | 29/830 |
| 5,225,966 | 7/1993 | Basavanhally et al. | 361/406 |
| 5,235,741 | 8/1993 | Mase | 29/830 |
| 5,241,456 | 8/1993 | Marcinkiewicz et al. | 361/792 |
| 5,261,593 | 11/1993 | Casson et al. | 228/180.22 |
| 5,318,651 | 6/1994 | Matsui et al. | 156/273.5 |
| 5,324,569 | 6/1994 | Nagesh et al. | 428/198 |
| 5,329,695 | 7/1994 | Traskos et al. | 29/830 |
| 5,346,118 | 9/1994 | Degani et al. | 228/180.22 |
| 5,346,775 | 9/1994 | Jin et al. | 428/614 |
| 5,364,707 | 11/1994 | Swisher | 428/612 |
| 5,376,403 | 12/1994 | Capote et al. | 427/96 |
| 5,401,909 | 3/1995 | Arnold et al. | 174/250 |
| 5,401,913 | 3/1995 | Gerber et al. | 174/264 |
| 5,409,157 | 4/1995 | Nagesh et al. | 228/180.22 |
| 5,429,293 | 7/1995 | Bradley, III et al. | 228/180.22 |
| 5,431,571 | 7/1995 | Hanrahan et al. | 439/91 |
| 5,435,732 | 7/1995 | Angulas et al. | 439/67 |
| 5,439,162 | 8/1995 | George et al. | 228/180.22 |
| 5,445,308 | 8/1995 | Nelson et al. | 228/121 |
| 5,450,290 | 9/1995 | Boyko et al. | 361/792 |
| 5,457,881 | 10/1995 | Schmidt | 29/852 |
| 5,468,655 | 11/1995 | Greer | 437/8 |
| 5,492,266 | 2/1996 | Hoebener et al. | 228/248.1 |
| 5,497,938 | 3/1996 | McMahon et al. | 228/253 |
| 5,538,789 | 7/1996 | Capote et al. | 428/344 |
| 5,545,281 | 8/1996 | Matsui et al. | 156/273.7 |
| 5,582,745 | 12/1996 | Hans et al. | 216/18 |
| 5,600,103 | 2/1997 | Odaira et al. | 174/265 |
| 5,634,265 | 6/1997 | Difrancesco | 29/825 |
| 5,736,681 | 4/1998 | Yamamoto et al. | 174/265 |
| 5,912,438 | 6/1999 | Kubin | 174/250 |

FOREIGN PATENT DOCUMENTS

| | | |
|---|---|---|
| 0 607 534 | 7/1994 | European Pat. Off. . |
| 2 407 738 | 8/1994 | Germany . |
| 56-68579 | 6/1981 | Japan . |
| 3-196650 | 8/1991 | Japan . |
| 3-209734 | 9/1991 | Japan . |
| 3-218030 | 9/1991 | Japan . |
| 4-133386 | 5/1992 | Japan . |
| 5-48230 | 2/1993 | Japan . |
| 6-160880 | 6/1994 | Japan . |

PRINTED CIRCUIT ASSEMBLY HAVING LOCALLY ENHANCED WIRING DENSITY

RELATED APPLICATION

The present application is a continuation-in-part application of U.S. patent application Ser. No. 08/583,645, now U.S. Pat. No. 5,839,388 entitled "Method and Manufacturing a Printed Circuit Assembly" filed Jan. 5, 1996.

FIELD OF THE INVENTION

The invention relates to printed circuit assemblies and methods of manufacture therefor. More particularly, the invention relates to printed circuit assemblies and methods of manufacture thereof, to provide a printed circuit board having locally enhanced wiring density.

BACKGROUND OF INVENTION

As the complexity and data processing speeds of electronic products continue to increase, the properties of the interconnecting circuitry which connects complex and high speed integrated circuit devices become more pronounced and must be carefully analyzed to ensure reliable circuit performance. Often, it is the increases in complexity and data processing speeds of integrated circuit devices that dictate performance improvements in the interconnecting circuitry to which the devices are mounted.

For example, the complexity of integrated circuit devices, and in particular the advent of surface mount technologies, dictate that greater densities of signal traces be packed into smaller packages to reduce costs and improve reliability. Signal trace widths and spacing has decreased to accommodate higher densities. Moreover, greater densities may be obtained with double-sided and multilayer printed wiring boards having multiple conductive layers that are typically electrically connected via conductive through holes.

Printed wiring boards typically include a number of high density areas in which electronic circuitry is located. In each of the high density areas, there is typically an associated high density of interconnections. Other areas of the circuit board typically require only relatively low electronic wiring densities for providing interconnection for connectors, discrete components, low pin count semiconductor devices and the like. However, conventional techniques of manufacturing printed wiring boards typically involve the production of individual layers of electronic circuitry of varying densities, of a single size. Upon production, the layers are aligned and laminated together to produce a multilayer board of the same size. These completed multilayer boards are then tested. If any portion of the multilayer board does not meet testing requirements or simply fails, the entire board has to be discarded.

Examples of such conventional techniques of manufacturing printed wiring boards are described in U.S. Pat. Nos. 5,401,909 and 5,582,745. Each of these patents describe printed circuit assemblies and associated methods of manufacture in which very high density circuitry is provided in regions where external components are to be directly attached. These patents describe the build up of a single layers of dielectric and metallization on the entire board and subsequently etching selected areas to provide various high density regions. Such a technique however, only provides for a single layer of electronic interconnection using complex build up technology with relatively low yield. In addition, as discussed earlier, should any portion of the resulting printed circuit assembly fail, the entire board has to be discarded.

Moreover, with the increasing integration density of semiconductor components such as microprocessors or logic chips, there is a proportional increase in the number and density of connecting input/output terminals on the chips. In addition, the requirements on critical signal delay times within data processing systems have demanded increasingly shorter minimum distances between critical chips. To accommodate this demand, the dimensions of electronic wiring on the printed wiring board have decreased to provide a corresponding increase in wiring density.

However, with such decrease in the dimensions of electronic wiring on the printed wiring board, the difficulty of manufacture increases, as does the difficulty of testing. Accordingly, it is becoming increasingly expensive to manufacture and to test multilayer boards with varying densities using conventional techniques.

Accordingly, there is a need in the technology for manufacturing a printed wiring assembly in which localized high density modules or nodes of density may be separately and individually manufactured and tested prior to alignment and attachment of the modules or nodes to a printed wiring board.

SUMMARY OF INVENTION

A printed circuit assembly and method of making the same facilitates the attachment of high density modules onto a printed circuit board. In one embodiment, the high density modules are attached to the printed circuit board using an adhesive having a conductive material disposed within at least one via. In an alternate embodiment, an adhesive layer including a plurality of non-conductive "gauge particles" disposed within a non-conductive adhesive is used to attach the module to the printed circuit board. When the adhesive layer is disposed between a module and a printed circuit, individual gauge particles are interposed or sandwiched at various points between the layers such that the diameters of the particles control the layer separation throughout overlapping areas of thereof, thereby permitting careful control over layer separation. A printed circuit assembly and method of making the same utilize in another embodiment an interlayer interconnecting technology incorporating conductive posts that are deposited on one of a pair of contact pads formed on a module that opposes a printed circuit board and is thereafter bonded to the other in the pair of contact pads during lamination. Fusible material may be utilized in the conductive posts to facilitate mechanical bonding to a contact pad, and the posts project through a dielectric layer disposed between the printed circuit boards, thereby forming the electrical connections between the boards at discrete locations. The conductive posts may also comprise a conductive ink.

DETAILED DESCRIPTION OF THE PREFERRED EMBODIMENTS

The invention addresses problems associated with the prior art in providing a printed circuit assembly and method of making the same which in one aspect involves attachment of one or more nodes of density or module onto a printed circuit board. In one embodiment, each node of density has a higher signal line and/or interconnection density than that of the printed circuit board. In addition, each node of density may have a different signal line and/or interconnection density than that of another node of density. In one embodiment, the nodes of density may be attached to the printed circuit board using a pressure-filled adhesive having vias filled with a conductive material such as a fusible conductive ink.

A second aspect of the invention utilizes an adhesive layer including a plurality of nonconductive "gauge particles" or other dielectric separators disposed within a nonconductive adhesive. When the adhesive layer is interposed between a node of density and a printed circuit layer, individual gauge particles are interposed or sandwiched at various points between the node of density and the printed circuit layers such that the diameters of the particles control the separation between the node of density and the printed circuit layers throughout the assembly.

By "printed circuit layer", what is meant is any layer within a printed circuit assembly, whether it is a layer within a node of density or a layer within a printed circuit board, whether conductive or non-conductive, and irrespective of its manner of deposition or placement on the assembly. Thus, a "printed circuit layer" may include conductive layers formed of metals or conductive polymers, flexible or rigid substrates, coverlayers, films, etc. Preferably, a "printed circuit layer" will be substantially non-deformable, so that any gauge particles abutting the layer will not substantially deform the layer, but will instead control its relative position within the assembly.

The invention addresses additional problems associated with the prior art in providing a printed circuit assembly and method of making the same which in another aspect interconnects contact pads on an overlapping pair of conductive layers through conductive posts formed on the contact pads on one layer and bonded to the contact pads on the other layer. Fusible material may be incorporated into the posts to form fused connections with the opposing contact pads. The posts may project through apertures in a dielectric layer separating the conductive layers, or alternately, the posts may "pierce" through the dielectric layer during lamination, thereby eliminating a separate aperture-formation step.

Figure 1:
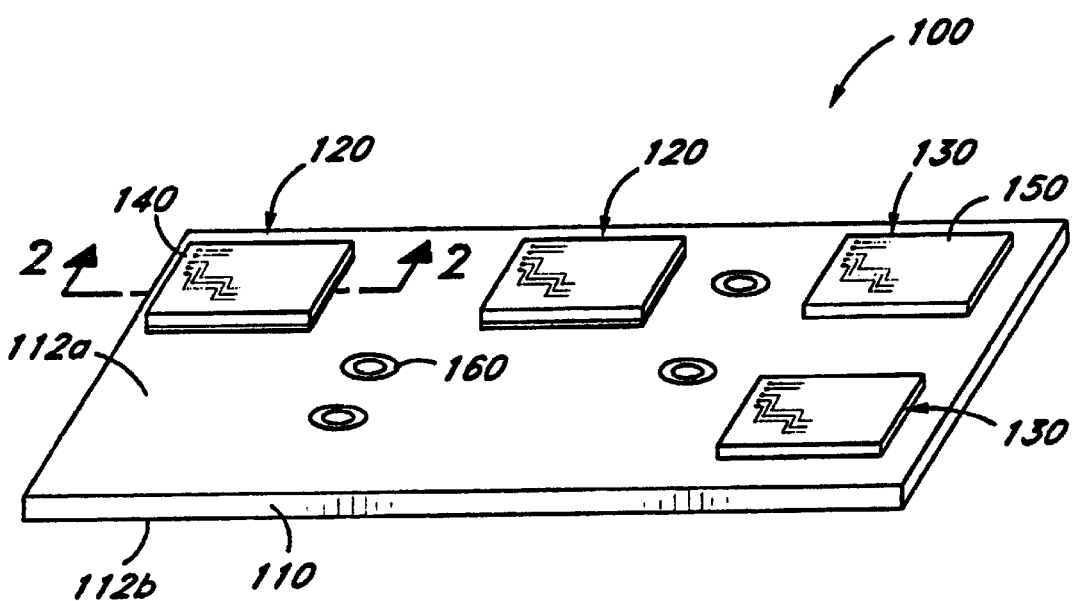
FIG. 1 is a perspective view of one embodiment of a printed circuit assembly in accordance with the principles of the invention.

One aspect of the invention involves methods for manufacturing a printed circuit assembly in which localized wiring density modules or nodes of density may be separately and individually manufactured and tested prior to alignment and attachment of the modules or nodes of density to a printed wiring board. FIG. 1 is a cross-section view of one embodiment of a printed circuit assembly provided in accordance with one aspect of the invention. The printed circuit assembly 100 comprises a printed circuit board 110 having a first region 120 of high density interconnections, and a second region 130 of high density interconnections. The first and second regions 120 and 130 respectively, may be located on one side 112a or 112b or both sides 312a–b of the printed circuit board 110, which has a lower density of interconnections.

Each region 120 and/or 130 comprises one or more nodes of density, such as nodes 140 and 150 respectively, having a predetermined number of interconnections or wiring density. The nodes 140 and 150 may have one or more conductive layers and each node 140 and 150 may have a different densities of interconnections. In one embodiment, the node 140 in the first region 120 has a larger number of interconnections or a higher wiring density than the node 150 in the second region 130. In addition, each node in a particular region may have a different number of interconnections or different wiring densities. The number of interconnections and/or signal lines formed in each node 140 and/or 150, is determined based on application and design. In addition, each node of density may have different electrical characteristics. For example, one node may be configured for coupling to a memory module, while other nodes may be configured for coupling to a graphics unit or a processor. Each of these nodes will thus have different wiring densities and electrical characteristics, depending on application and design. Each node 140 and/or 150 may be individually and/or separated manufactured and tested, prior to alignment and attachment onto the printed circuit board 110, in accordance with the principles of the present invention. For present discussion purposes, each node of density, such as node 140 and/or 150, will be referred to generally as a node of density or node 140.

One principle benefit of the invention is to selectively provide nodes of signal line and/or interconnection density on a printed circuit board. As discussed, such nodes of density may differ in the number of conductive layers attached to a corresponding substrate, or in the density of signal line and/or interconnections. In addition, each node may be separately manufactured and individually tested, prior to alignment and attachment of the nodes to the printed circuit board 110. Another benefit of the invention is the ability to reliably control circuit layer separations through the use of an adhesive layer having gauge particles dispersed therein. Controlled layer separation may be beneficial for controlling impedance, as well as to ensure planarity throughout an assembly. A further benefit of the invention is the attachment of the nodes of density onto the printed circuit board using pressure-filled conductive ink in a conductive adhesive. Such an adhesive provides excellent bonding of the nodes to the printed circuit board.

One embodiment of the invention operates by interposing controlled diameter gauge particles between opposing or overlapping portions of printed circuit layers and compressing the circuit layers such that the particles abut both opposing layers and thereby define the separation therebetween. Moreover, considering the stability and non-deformability of many printed circuit materials, controlling the separation between printed circuit layers also controls the separation between other layers connected thereto. This also has the effect of minimizing any additive planarity distortions in a multiple layer printed circuit assembly.

The gauge particles may be interposed between any two opposing layers, which as discussed above may include numerous materials, including conductive layers formed of metals or conductive polymers, flexible or rigid substrates, coverlayers, films, etc. These layers are preferably substantially non-deformable so that they will abut the particles but will not substantially deform or compress at their point of abutment with the particles, to thereby fix their relative separations in the assembly.

Figure 2A:
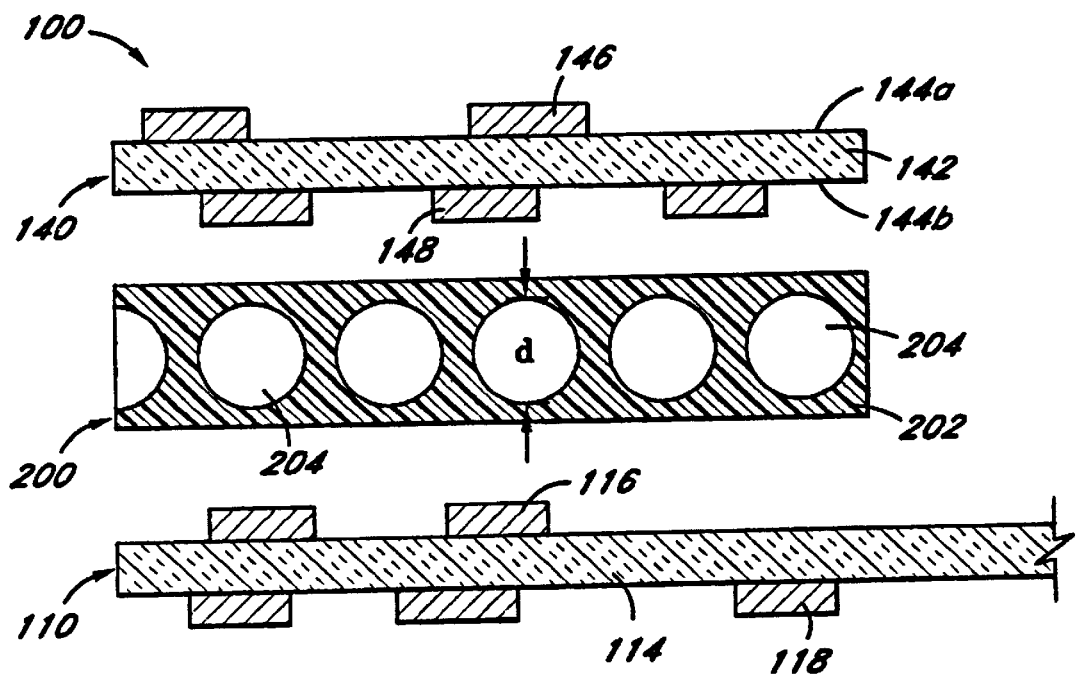
FIG. 2A is an exploded cross-sectional view of the printed circuit assembly of FIG. 1.
Figure 2B:
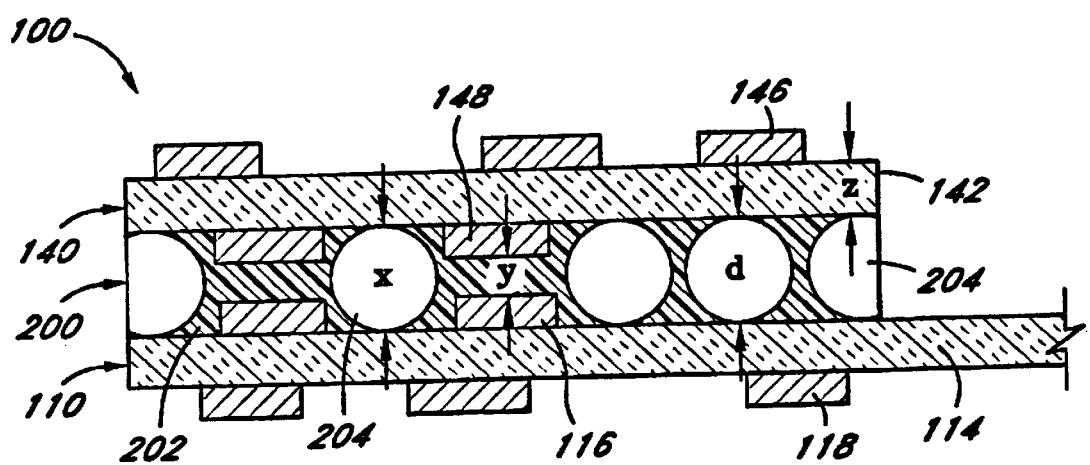
FIG. 2B is a cross-sectional view of a preferred printed circuit assembly, taken through line 3—3 of FIG. 1

For example, one preferred embodiment of the invention, printed circuit assembly 100 shown in FIGS. 1–2B, utilizes gauge particles which are sized to abut opposing insulating substrates. With conductive layers mounted to the substrates, the separation between the conductive layers is also controlled, which may be important for impedance control, as well as form maintaining planarity throughout the assembly.

FIGS. 2A and 2B illustrate a detailed cross-section view of one embodiment of the printed circuit assembly of FIG. 1. As shown, the node 140 comprises a substrate 142 having two sides 144a and 144b, and two opposing conductive layers 146 and 148. In an alternate embodiment, the node 140 may include only one conductive layer 146 or 148, located on either side 144a or 144b of the substrate 142. In further alternate embodiments, the node 140 may include two or more conductive layers located on either side 144a or 144b of the substrate 142.

The substrate 142 may be any type of flexible or rigid dielectric material suitable for use as a substrate, including polyimide, polyester, PEN, polyetherimide, (epoxy, ceramic, impregnated woven or non-woven glass, among others. In one embodiment, each conductive layer 146 and/or 148 may be attached to the substrate 142 and onto another conductive layer in any manner generally known in the art for providing high density conductive layers, including various thin film, additive, semi-additive or subtractive techniques. Deposition of the conductive layers 146 and/or 148 may also be performed via adhesiveless processes such as vacuum metallization, sputtering, ion plating, chemical vapor deposition, electroplating, electroless plating, etc., as well as through the use of adhesives. The conductive layers may be formed of single metal layers or composite layers formed by different processes, and may include metals such as copper, gold, chromium, aluminum, palladium, tin, etc., as well as conductive polymers and the like.

In the preferred embodiment, substrates 142, 114 are formed of polyimide, and conductive layers 114, 116, 146, 148 are formed via the NOVACLAD process, which is the subject matter of U.S. Pat. Nos. 5,112,462; 5,137,791 and 5,364,707 to Swisher, and assigned to Sheldahl, Inc. process generally includes the steps of (1) treating the substrate with a plasma made up of ionized oxygen produced from a metallic electrode to form a metal/oxide treated film and (2) forming metallized interconnection layers on the treated film, preferably either by vacuum metallization of metal, or by combination of vacuum metallization of metal and an additional step of electroplating metal on top of the vacuum-deposited metal. The first step in the process produces a bonding surface on the film which is capable of securing metal interconnection layers which, unlike adhesive-based substrates, have excellent delamination resistance, especially when exposed to heat, chemical treatment, mechanical stress or environmental stress. board, thus metallized, may be etched in a conventional manner to form the desired circuit patterns in the conductive layers.

Through holes 160 may be formed on the printed circuit board 110 and on the substrate 142 by drilling vias in the printed circuit board 110 or by drilling vias in the substrate 142 prior to metallization. In some applications the conductive material deposited on the via walls may completely fill the vias, such that no aperture remains within the through hole. Coverlayers may also be deposited over the patterned conductive layers in some applications. Other variations, for example, drilling after plating, as will be apparent to one of ordinary skill in the art, may be performed.

Once formed, the module or node 140 may be attached to the printed circuit board 110 using the techniques of the present invention. As shown in FIGS. 2A and 2B, the printed circuit board 110 comprises a substrate 114 and opposing conductive layers 116 and 118. In an alternate embodiment, the conductive layers 116 and 118 may be located on only one side of the substrate 114. The conductive layers 116 and 118 may be attached to the substrate 114 using any one of the techniques discussed for attaching the conductive layers 146 and 148 to the substrate 142, as discussed above.

As shown in FIG. 2A, an adhesive layer 200 is interposed between board 110 and the module or node 140. In one embodiment, layer 200 is a dried and cured B-stage layer formed of a plurality of nonconductive gauge particles 204 interspersed in a nonconductive adhesive 202. Alternatively, the layer 200 may be deposited on one of the printed circuit board 110 or the module or node 140 via screen printing, roll coating or another suitable process. In one embodiment, the adhesive 202 used in layer 200 is a nonconductive thermosetting adhesive such as polyimide, epoxy, butyrl phenolic, etc. and combinations thereof. Other adhesives such as pressure sensitive and thermoplastic adhesives may also be used in the alternative. The adhesive used should have suitable adhesive and flow characteristics, and may be selected based upon concerns such as dielectric constant and temperature resistance. The adhesive used in the preferred embodiment is a polyimide thermosetting adhesive, which has a dielectric constant of about 4.4 (measured at 1 MHz under 4.8.3.1.4 of Mil-P-13949 Std.), and which is also high temperature resistant.

The gauge particles are preferably non-compactible spherical particles formed of solid or hollow non-conductive material such as glass, polymer, silica, ceramic, etc. The material used for the particles may also be selected based upon a specific dielectric strength to tailor the adhesive layer to a controlled dielectric constant. In addition, through the use of low dielectric constant particles, the overall dielectric constant of the adhesive layer may be decreased below that of the adhesive itself. The particles may also have different geometries than spherical. In the preferred embodiment, the particles are hollow glass spheres. Using the preferred size and distribution ranges for the particles, this results in an overall dielectric constant for the adhesive layer of about 1.5 to 3 (measured at 1 Mhz under 4.8.3.1.4. of Mil-P-13949 Std.).

The sizes of the particles are preferably controlled to be substantially the same throughout the adhesive layer, with preferably at least 30 percent of the particles being between about +/−10 percent of a mean diameter. Moreover, the loading or distribution of particles in the adhesive is preferably about 30 to 75 percent by volume, although other particle densities may be required in different applications, particularly where the particles are used to define the separations between other types of printed circuit layers. In addition, the final separation distances, the layouts of the boards, and other considerations may also impact the sizes and distributions of the particles in the adhesive.

In use, the particles are preferably dispersed uniformly throughout the adhesive, then the adhesive is layered, dried and cured to form a B-stage adhesive layer. The layer is then interposed between the printed circuit boards, and the entire assembly is laminated under heat and pressure to compress the boards together, as shown in FIG. 2B. Under lamination, the gauge particles are trapped between the circuit boards to abut the opposing insulating layers at areas where there are no conductive layers. In areas where one or more conductive layers are present, the particles are typically displaced to areas having no conductive layers (i.e., "exposed areas" of the insulating substrates). In addition, the adhesive flows into the recesses between the boards, and any excess adhesive is squeezed out of the sides of the assembly. The extent to which the boards are compressed together during lamination is determined by the diameters of the gauge particles, as these particles abut opposing printed circuit layers to define the final layer separations for the assembly.

As shown in FIGS. 2A and 2B, the gauge particles 204 are sized to abut opposing substrates 142 and 114. With conductive layers 146, 148 and 116, 118 mounted to the respective substrates 142 and 114, the separation between the conductive layers is controlled.

As noted above, the mean diameter for the population of particles is preferably selected to provide controlled separation between printed circuit layers. In the embodiment shown in FIGS. 2A and 2B, the diameter of the gauge particles d is preferably selected to control the connected distance x between insulating substrates 142 and 114 (see FIG. 12B). By virtue of the substantially nondeformable nature of substrates 142, 114, controlling the distance between these layers also indirectly controls the distance y between the conductive layers 148, 118.

Figure 3A:
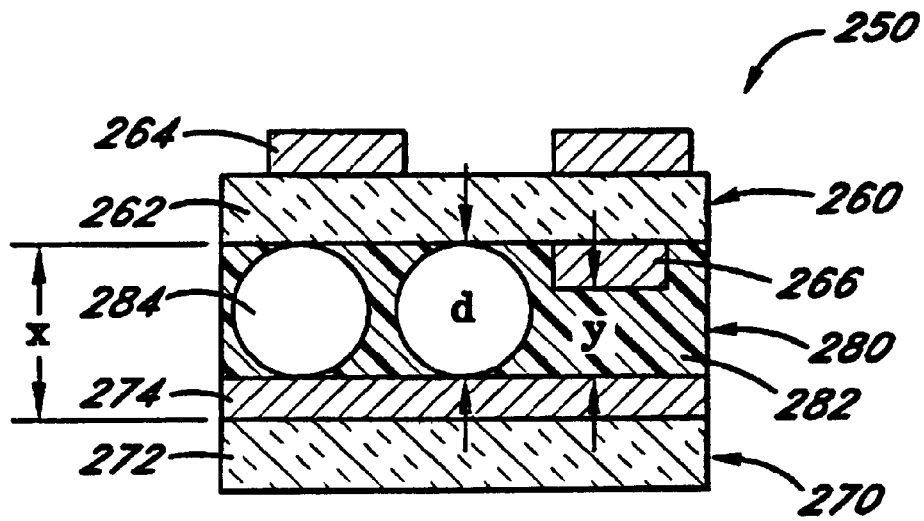
FIG. 3A is a cross-sectional view of an alternate embodiment of the printed circuit assembly of FIG. 1, where gauge particles are disposed between an insulating substrate and a conductive layer.

As stated above, however, the gauge particles are not limited to abutting opposing insulating substrates. For example, FIG. 3A illustrates an assembly 250 having an adhesive layer 280 (having gauge particles 284 disposed in an adhesive 282) for bonding together a node of density 260 to a printed circuit board 270, with respective insulating substrates 262, 272 and respective conductive layers 264, 266, 274. In this embodiment, the plurality of gauge particles 284 abut, on node 260, the insulating substrate 262; and on printed circuit board 270, the conductive layer 274. Again, the diameters d of the particles are controlled to indirectly set the distance y between the conductive layers 266, 274, as well as the distance x between the insulating substrates 262, 272. During lamination, the particles are displaced from any areas having two layers of overlapping conductive material. The configuration shown in FIG. 3A may be useful in applications having ground, power or shield planes where conductive material fully covers a surface of at least one printed circuit board.

Figure 3B:
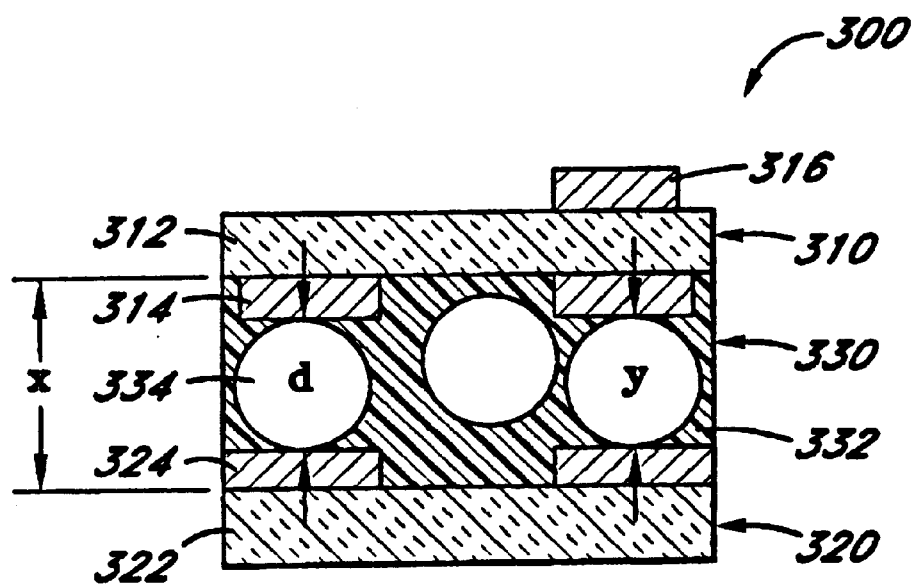
FIG. 3B is a cross-sectional view of an alternate embodiment of the printed circuit assembly of FIG. 1, where gauge particles are disposed between a pair of conductive layers.

As another example, FIG. 3B illustrates an assembly 300 having an adhesive layer 330 (having gauge particles 334 disposed in an adhesive 332) for bonding together a pair of printed circuit boards 310, 320, with insulating substrates 312, 322 and conductive layers 314, 316, 124. In this configuration, the diameters d of the particles are controlled to directly set the distance y between the conductive layers 314, 324, as well as to indirectly set the distance x between the insulating substrates 312, 322. Any particles disposed in areas without any overlapping conductive material tend to "float" within the adhesive and not control layer separation. In addition, due to the non conductive nature of the particles, they do not conduct across the adhesive layer and cause any potential undesired short circuits in the assembly. Consequently, a significant advantage is attained in that controlled mechanical separation is provided between conductive layers without introducing undesired conductive paths through the adhesive layer. Moreover, coverlayers are often not required, thereby reducing manufacturing costs and complexities, as well as overall assembly thicknesses.

Other printed circuit layers may abut the gauge particles, including any coverlayers formed over the conductive layers on a circuit board. Additional printed circuit boards may also be bonded together using additional adhesive layers, e.g., to produce multilayer assemblies having five or more conductive layers. In addition, a dielectric material may be "filled in" between circuit traces to provide a more planar surface for the printed circuit boards, whereby the gauge particles would abut two types of layers on the same printed circuit board.

Further, it may be desirable to utilize otherwise open areas of the insulating substrates ("non-signal transmitting areas"—that is, those areas where conductive material would otherwise not be used) to pattern conductive material which assists in controlling separation in these areas. The conductive material in these non-signal transmitting areas may serve no other purpose than controlling separation, or it may be used as shielding or other purposes, for example.

Moreover, different particle sizes may be used in different areas of an assembly, e.g., if a ground or shield plane is only provided in one area of an assembly, and the particles and/or adhesive may be used in only some overlapping portions of the circuit boards. In addition, other manners of depositing an adhesive layer and compressing the assembly may also be used. Other modifications will be apparent to one skilled in the art.

Figure 4A:
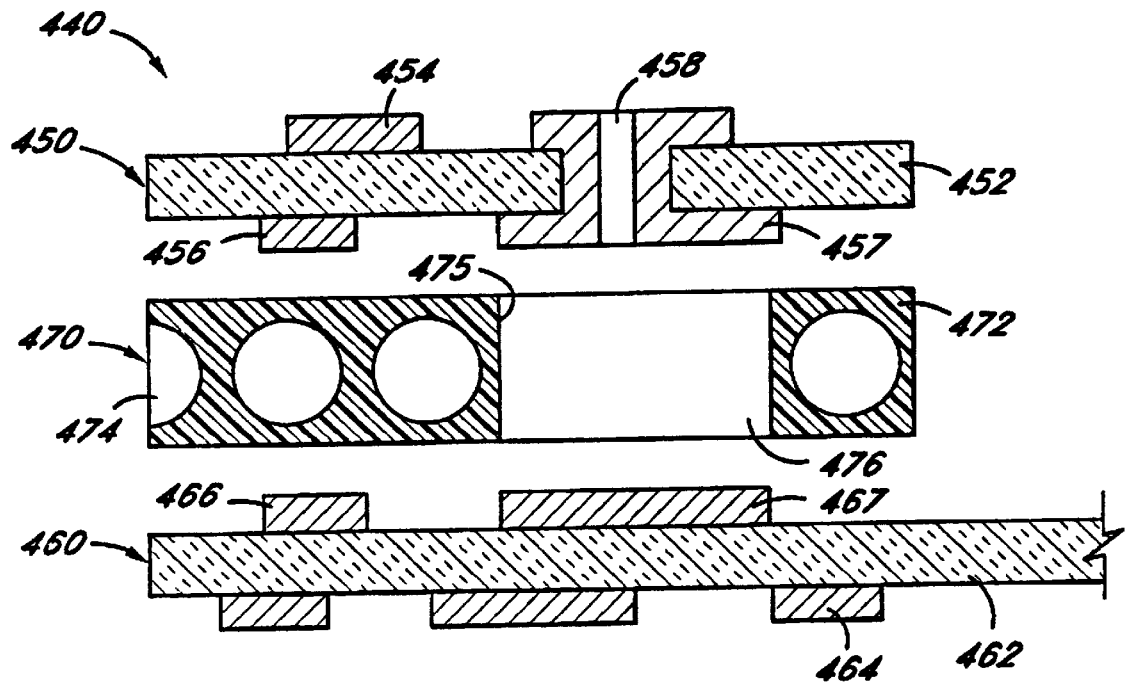
FIG. 4A is an exploded cross-section view of a further embodiment of the printed circuit assembly of FIG. 1, where a conductive plug is formed in the adhesive layer to electrically connect opposing contact pads.
Figure 4B:
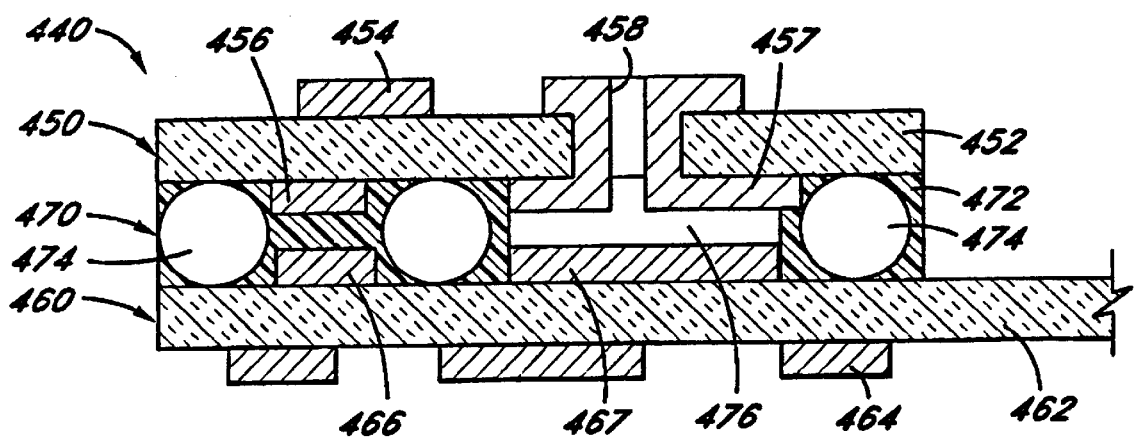
FIG. 4B is a cross-section view of the alternate printed circuit assembly of FIG. 4A.

The adhesive layer 200 may also include pad interconnecting structures for electrically connecting any contact pads on the printed circuit board 110 or on the module or node 140 at discrete locations across the adhesive layer 200. Any number of techniques may be used to form conductive areas through an adhesive layer. In one embodiment, such conductive areas may be provided by forming deformable and/or fusible conductive "plugs" in an adhesive layer prior to lamination. For example, printed circuit assembly 440 of FIGS. 4A and 4B illustrate one technique of forming pad connections in which an aperture 475 is formed in an adhesive layer 470 (having gauge particles 474 in an adhesive 472) and filled with conductive material 476. The resulting layer is interposed between a module or node 450 and a printed circuit board 460 (with respective substrates 452, 462 and respective conductive layers 454, 456, and 464, 466), with the conductive material 476 in layer 470 aligned with opposing pads 457 (e.g., formed at a through hole 458) and 467. When the assembly is laminated (FIG. 4B), conductive material 476 preferably fuses with pads 457, 467 to form a reliable interconnection therebetween concurrent with the placement of particles 474 between substrates 452, 462. Apertures 475 in layer 470 may be formed by drilling, punching, stamping, laser ablation, etc. Conductive material 476 may be deposited in the apertures by a number of processes, including electroplating, screen printing, ink jet printing, etc. The conductive material may be a metal such as copper, or may be a conductive ink (cured or uncured) or a fusible material such as solder particles.

Two preferred techniques include screen printing a fusible conductive ink, and ink jet printing fine solder particles.

Other techniques of forming interlayer interconnections, e.g., drilling and plating through holes after lamination, may also be used without departing from the spirit and scope of the invention.

Figure 5A:
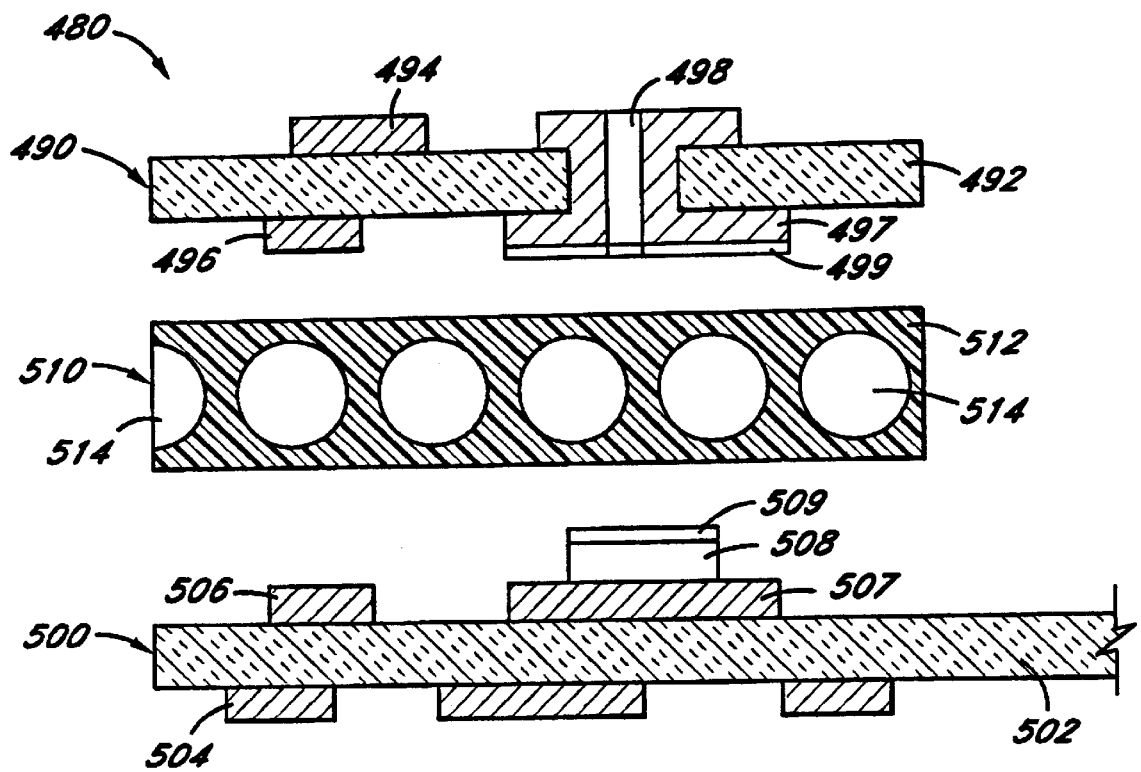
FIG. 5A is an exploded cross-section view of another alternate embodiment of the printed circuit assembly of FIG. 1, where a conductive post projects through the adhesive layer to electrically connect opposing contact pads.
Figure 5B:
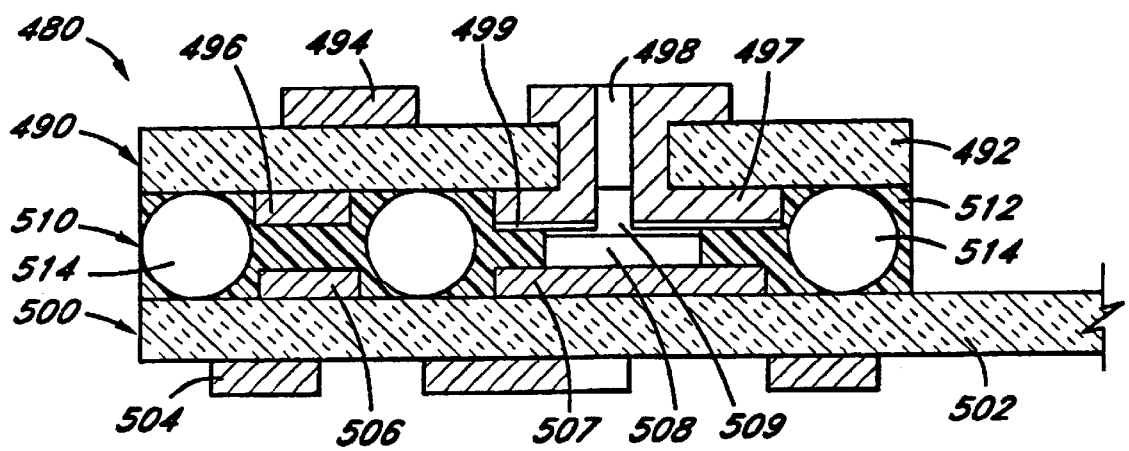
FIG. 5B is a cross-section view of the alternate printed circuit assembly of FIG. 5A.

FIG. 5A and 5B are detailed cross-section views of a second embodiment of the printed circuit assembly of FIG. 1, in which a conductive post projects through the adhesive layer to electrically connect opposing contact pads. As noted in earlier sections, an interlayer interconnection may be formed between opposing conductive layers in a printed circuit assembly, in particular by forming conductive "posts" or similar structures on a printed circuit board or which are bonded with a pad on another printed circuit board. This principle may be applied to forming conductive "posts" or similar structures on either a node of density such as node 140 or a printed circuit board, such as board 110, which are bonded with a pad on either a printed circuit board such as board 110 or a node of density such as node 140, respectively. This aspect of the invention is particularly suitable for use in conjunction with providing controlled separation using an adhesive layer in the manner disclosed herein. However, it will be appreciated that this interlayer interconnection process may also be used across other dielectric layers, as will be set forth below.

For example, printed circuit assembly 480 of FIGS. 5A and 5B illustrate a technique of forming interlayer pad connections whereby a printed circuit board 500, with a pair of conductive layers 504, 506 formed on a substrate 502, has a conductive post formed on a contact pad 507. The post is comprised of an electrically conductive layer 508 such as copper, and coated by a fusible material 509 such as tin. In one embodiment, the electrically conductive layer 508 and the fusible material 509 such is copper and tin respectively, are deposited by electroplating using a semi-additive process, although other processes, including subtractive and additive metal deposition processes, screen printing processes, stencil printing processes (e.g., stenciling conductive ink coupled with subsequent curing/sintering of the ink), etc. may also be used. Other conductive materials such as any number of binary and tertiary metals, fusible materials, and combinations thereof may be used for layer 508.

In one embodiment, a layer of dry film photoresist is applied over a copper foil printed circuit board, then the photoresist is imaged with the desired circuit through pattern over the pattern circuit pattern and developed, and copper is electroplated the resulting mask to form the desired circuit pattern. Next, a second layer of photoresist is applied first layer and is exposed and developed with the of the conductive posts to be formed on the printed. The posts are electroplated to thickness with copper, then capped by an electrodeposited layer of tin. The photoresist is stripped off and the excess copper is etched away.

The thickness to which copper layer 508 on each post is plated is primarily dependent upon the desired connected distance between the opposing contact pads, and when used in conjunction with gauge particle-filled adhesive, is dependent upon the diameters of the particles. For example it may be desirable to provide connected distances between pads in the range of about 1 to 4 mils (50 to 100 microns), with the thickness of copper layer 508 preferably being in a similar range. Tin layer 509 is preferably immersion, electroless or electroplated to a thickness selected to provide sufficient material for forming a fused connection between copper layer 508 and the opposing contact pad, preferably in the range of about 8 to 50 microinches.

The posts can also have different profiles, e.g., circular, rectangular, etc. Moreover, the maximum width or diameter of the posts may be selected depending upon resistance requirements, current handling capability, and contact pad size, typically in the range of about 50 to 100 microns. The posts, however, typically do not require any additional surface area on a board beyond the contact pads to which they are mounted, and they are preferably about ½ the diameter of the contact pads to allow for some misalignment. Accordingly, in preferred embodiments, the posts generally do not significantly impact the overall pitch (i.e., the minimum combined signal trace spacing and width) of the board.

Printed circuit board 500 is interconnected via lamination to a module or node 490 (with conductive layers 494, 496 formed on a substrate 492) across an adhesive layer 510 (with gauge particles 514 in an adhesive 512). The module or node 490 is similar to the module 140. Prior to lamination, it may be desirable to deposit, e.g., by immersion, electroless or electroplating, an adhesion promoting layer 499 over the contact pads, e.g., pad 497. Layer 499 may be, for example, about 8 to 50 microinches in thickness, and formed of gold or a similar material that promotes adhesion with a fusible metal such as tin layer 409. The adhesion promoting layer may also not be necessary in some applications.

During lamination (FIG. 5B), the post formed of layers 508, 509 may "pierce" through layer 510 and contact pad 497 (shown at through hole 498) formed on module 490. Fusible layer 509 preferably reflows and fuses to the gold layer 499 over pad 497 to form a reliable electrical interconnect with pad 507. Due to the high unit load of the posts, they will generally displace the adhesive to permit the fusible layers to fully contact the opposing pads and form the fused connections therebetween. Also due to their high unit load, the posts also displace the gauge particles during the lamination process as shown in FIG. 5A. With further compression, the gauge particles in the adhesive layer begin to share a portion of the applied load, resulting in both controlled separation and reliable interconnects in the finished assembly. Alternatively, as above with other interlayer interconnections, apertures may be drilled or formed in adhesive layer 510 with the apertures aligned with the posts, as opposed to the posts forming their own apertures.

As was mentioned previously, the post interlayer interconnection technology disclosed herein may also be used to form interconnections across other dielectric layers. For example, as shown in the assembly 520 of FIG. 6, a node of density 530 and a printed circuit board 540 may be interconnected across a dielectric layer 550 with a post having copper layer 544 and fusible material 546, formed on board 540, and fused to board 530. Dielectric layer 550 preferably includes an aligned aperture 556 through which the post may project.

Figure 6:
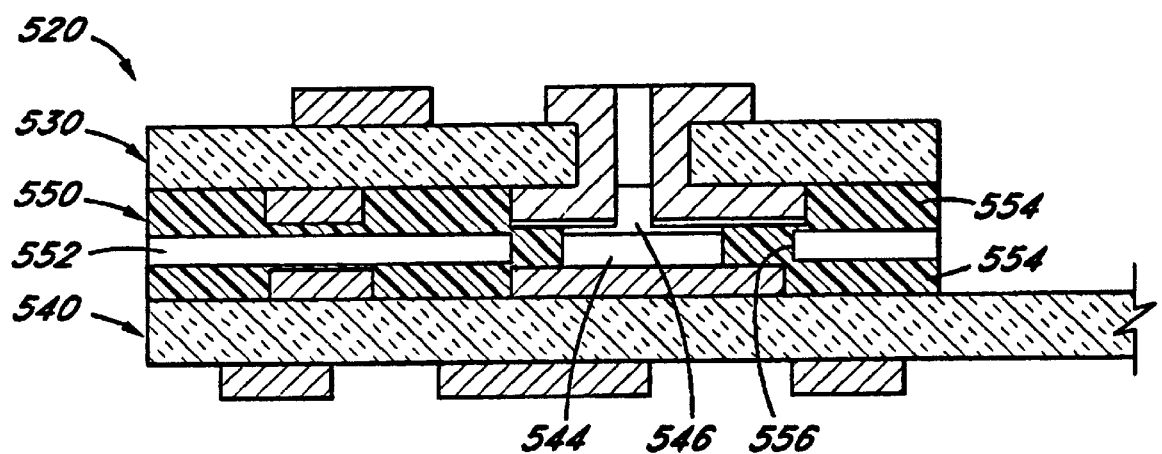
FIG. 6 is a cross-section view of another alternate embodiment of the printed circuit assembly of FIGS. 5A and 5B, where an alternate dielectric layer is disposed between opposing printed circuit boards.

Numerous dielectric layer constructions may be used to bond the node 530 and board 540 together. For example, as shown in FIG. 6, dielectric layer 550 may include a base dielectric film 552 coated on both sides with an adhesive 554. Alternatively, the dielectric film may be a prepreg composition of woven glass impregnated with adhesives. Other dielectric layers, such as non-woven glass and film tapes, etc., or any other form of dielectric layer suitable for bonding opposing boards to one another may also be used.

It is also possible to utilize a dielectric layer having a base film or sheet with a predetermined grid or pattern of apertures at known locations. Through proper circuit design, posts may be located to be aligned with apertures, thereby eliminating the need to specially drill a dielectric layer.

It is believed that the use of interconnecting posts in the manner disclosed herein provides reliable interlayer interconnects in a simple, reliable and cost effective manner. Moreover, the posts may be constructed with fine dimensions and spacing, thereby increasing the obtainable packaging density for a printed circuit assembly. In addition, the posts are capable of forming intermetallic joints, which are typically much more reliable than adhesive joints due to the metallurgical interaction of such joints. The posts also have the benefit of being deposited using standard photolithographic techniques at generally the same resolution of the overall circuit patterns, and they also reduce material costs because discrete conductive interconnections may be made only at desired locations on the boards. Further, the posts may be made smaller than the contact pads to which they are connected, thereby allowing for some misalignment of the pads during lamination. Other benefits will be appreciated by one skilled in the art.

Figure 7:
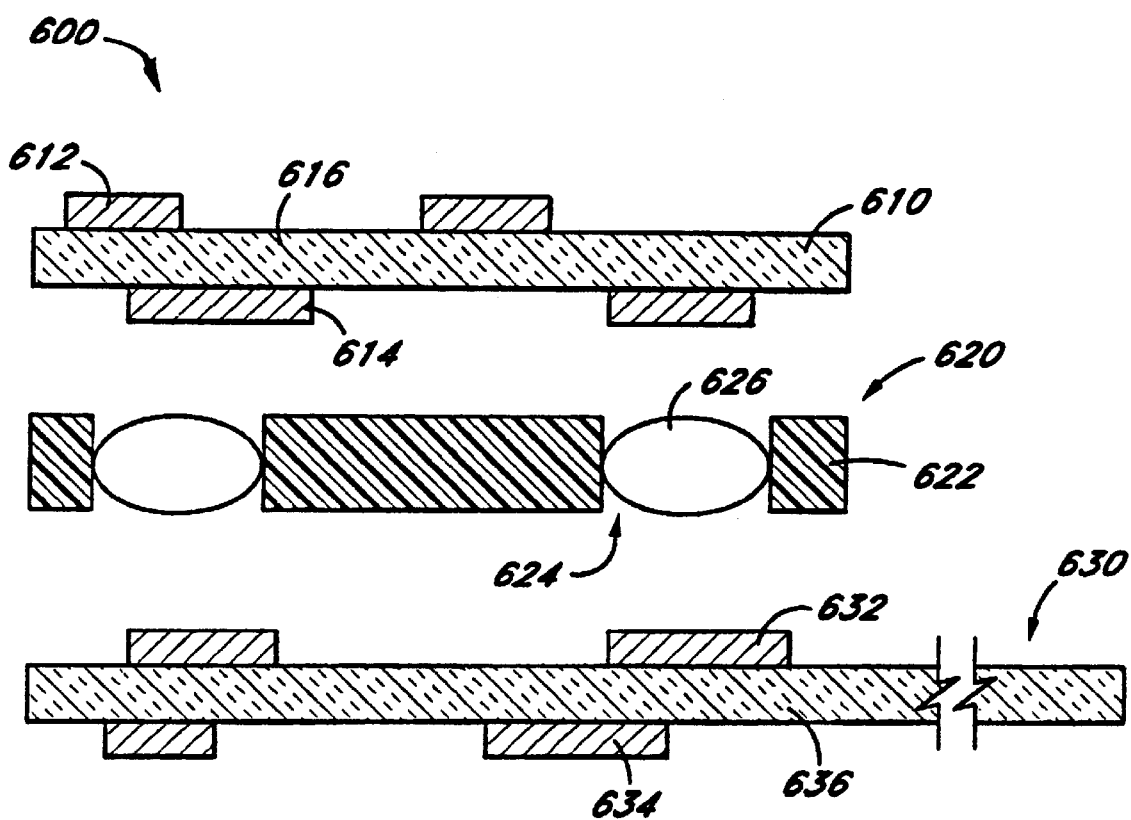
FIG. 7 is a cross-section view of a further embodiment of the printed circuit assembly 100 of FIG. 1.

FIG. 7 illustrates a further embodiment of the printed circuit assembly 100 of FIG. 1. In this embodiment, the node of density 610 is bonded to the printed circuit board 630 using an adhesive 620. In one embodiment, the adhesive 620 is a pressure-filled adhesive. In one embodiment, the adhesive 620 comprises an adhesive layer 622 with vias 624 that are filled with a conductive material 626. In one embodiment, the conductive material 626 is a conductive ink. The vias 624 are aligned with the conductive layers 614, 632 of the module 610 and printed circuit board 630 respectively, depending on design and application, using techniques known by one of skill in the art.

Through the implementation of the invention, a printed circuit board having localized wiring density modules or nodes of density may be provided. The nodes of density may be separately and individually manufactured and tested prior to alignment and attachment to the printed wiring board. As a result, manufacturing costs may be reduced, while increasing product yield.

Other changes and modifications may be made to the preferred embodiments without departing from the spirit and scope of the invention. Therefore, the invention lies in the claims hereinafter appended.

What is claimed is:

1. A printed circuit assembly comprising:

at least one module having at least one substrate with a conductive layer disposed thereon, the conductive layer having a first plurality of signal lines;

a printed circuit having a substrate with a conductive layer disposed thereon, the conductive layer on the printed circuit board having a second plurality of signal lines, wherein the second plurality of signal lines has a density that is lower than that of the first plurality of signal lines; and a dielectric layer disposed between the module and the printed circuit board;

wherein each of the at least one module and printed circuit board comprise a perimeter, the perimeter of the printed circuit board being larger than the perimeter of each of the at least one module.

2. The printed circuit assembly of claim 1, further comprising:

a second module having at least one substrate with a conductive layer disposed thereon, the conductive layer having a third contact pad and a third plurality of signal lines, wherein the conductive layer on the printed circuit board has a fourth contact pad opposing the third contact pad and wherein the dielectric layer is further disposed between the second module and the printed circuit board.

3. The printed circuit assembly of claim 1 wherein the dielectric layer has at least one via, said via having a conductive material disposed therein, said conductive material electrically connecting the conductive layer of the printed circuit board and the conductive layer of the at least one module.

4. The printed circuit assembly of claim 3, wherein said conductive material is a conductive ink.

5. The printed circuit assembly of claim 3, further comprising a second module having at least one substrate with a conductive layer disposed thereon, the second module having a third plurality of signal lines, said pressure-filled dielectric layer having a second via that has a conductive material disposed therein, said conductive material in said second via electrically connecting the conductive layer of the printed circuit board and the conductive layer of the second module.

6. The printed circuit assembly of claim 3, wherein the dielectric layer comprises a cured thermosetting adhesive bonding the module and the printed circuit board to one another.

7. The printed circuit assembly of claim 6, wherein the dielectric layer further comprises a dielectric film coated on both sides with the adhesive and the at least one via extends through the film and adhesive.

8. The printed circuit assembly of claim 6, wherein the dielectric layer further comprises a prepreg sheet filled with the adhesive and the at least one via extends through the sheet and adhesive.

9. A printed circuit assembly comprising:

at least one module having at least one substrate with a conductive layer disposed thereon, the conductive layer having a first contact pad and a first plurality of signal lines;

a printed circuit having a substrate with a conductive layer disposed thereon, the conductive layer on the printed circuit board having a second contact pad opposing the first contact pad, the printed circuit board having a second plurality of signal lines, wherein the first plurality of signal lines has a density that is higher than the second plurality of signal lines;

a dielectric layer disposed between the module and the printed circuit board; and a conductive post, formed on the first contact pad, the conductive post extending across the dielectric layer and abutting the second contact pad, thereby electrically connecting the first and second contact pads and providing a predetermined separation between the conductive layer of the printed circuit board and the conductive layer of the module.

10. A printed circuit assembly, comprising:

at least one module having at least one substrate with a conductive layer disposed thereon, the at least one module having a first electrical density;

a printed circuit board having a second electrical density, the second electrical density being lower than the first electrical density;

a dielectric layer disposed between the module and the printed circuit board, said dielectric layer having at least one via, said via having a conductive material disposed therein, said conductive material electrically connecting the conductive layer of the printed circuit board and the conductive layer of the at least one module, the dielectric layer comprising a cured thermosetting dielectric layer bonding the module to the printed circuit board.

* * * * *